(12) United States Patent
Goenka

(10) Patent No.: US 11,431,329 B2
(45) Date of Patent: Aug. 30, 2022

(54) DEGLITCHING CIRCUIT

(71) Applicant: TEXAS INSTRUMENTS INCORPORATED, Dallas, TX (US)

(72) Inventor: Vibha Goenka, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/135,395

(22) Filed: Dec. 28, 2020

(65) Prior Publication Data

US 2022/0209756 A1  Jun. 30, 2022

(51) Int. Cl.
| | |
|---|---|
| *H03K 5/1252* | (2006.01) |
| *H03K 3/017* | (2006.01) |
| *H03K 19/20* | (2006.01) |
| *H03K 5/24* | (2006.01) |
| *H03K 3/037* | (2006.01) |
| *H03K 19/003* | (2006.01) |

(52) U.S. Cl.
CPC ........... *H03K 5/1252* (2013.01); *H03K 3/017* (2013.01); *H03K 3/037* (2013.01); *H03K 5/24* (2013.01); *H03K 19/00346* (2013.01); *H03K 19/20* (2013.01)

(58) Field of Classification Search
CPC ...... H03K 5/1252; H03K 3/017; H03K 3/037; H03K 5/24; H03K 19/20; H03K 17/16; H03K 17/165; H03K 19/00346; H03K 19/003
See application file for complete search history.

(56) References Cited

U.S. PATENT DOCUMENTS 8,975,921 B1 * 3/2015 Sangolli ................. H03K 19/08
326/93

* cited by examiner

*Primary Examiner* — Jung Kim
(74) *Attorney, Agent, or Firm* — Michael A. Davis, Jr.; Charles A. Brill; Frank D. Cimino

(57) ABSTRACT

A circuit includes a first delay filter, a first comparator, an inverter, a second delay filter, a second comparator, an OR gate, and a latch. A first delay filter input is coupled to an inverter input. The first comparator has a first comparator input coupled to a first delay filter output and a second comparator input. The second delay filter has an input coupled to an inverter output. The second comparator has a third comparator input coupled to a second delay filter output, and a fourth comparator input coupled to the second comparator input. The OR gate has an input coupled to a first comparator output and another input coupled to a second comparator output. The latch has a clock input coupled to an OR gate output and a latch input coupled to the inverter input. A latch output provides a deglitched signal.

17 Claims, 4 Drawing Sheets

DEGLITCHING CIRCUIT

BACKGROUND

Various circuits provide digital logic signals that control the operation of other circuits. For example, a reference clock generator provides a digital clock signal having rising and falling edges that trigger functionality in a receiving circuit. Another example is a pulse-width modulation (PWM) signal generator, which provides a digital PWM signal having a pulse width that controls a duty cycle of a receiving circuit, such as a power stage of a voltage converter (e.g., a direct current (DC) DC converter). Irrespective of the type of generator circuit, the provided digital logic signal can be corrupted by distortion, often referred to as glitches. A glitch can cause the signal to cross the threshold between a logic 0 (e.g., a LOW signal) and a logic 1 causing the value of the signal to be misinterpreted by the receiving circuit.

SUMMARY

In at least one example, a circuit includes a first delay filter having a first delay filter input and a first delay filter output; a first comparator having a first comparator output and first and second comparator inputs, the first comparator input coupled to the first delay filter output; an inverter having an inverter input and an inverter output, the inverter input coupled to the first delay filter input; a second delay filter having a second delay filter input and a second delay filter output, the second delay filter input coupled to the inverter output; a second comparator having a second comparator output and third and fourth comparator inputs, the third comparator input coupled to the second delay filter output, and the fourth comparator input coupled to the second comparator input; an OR gate having an OR gate output and first and second OR gate inputs, the first OR gate input coupled to the first comparator output, and the second OR gate input coupled to the second comparator output; and a latch having a clock input, a latch input and a latch output, the clock input coupled to the OR gate output, the latch input coupled to the inverter input. The latch is configured to provide a deglitched signal at the latch output responsive to the inverter input.

In another example, a system includes a clock signal generator and a deglitching circuit coupled to the clock signal generator, the deglitching circuit having a deglitching circuit input and a deglitching circuit output. The deglitching circuit includes a first delay filter having a first delay filter input and a first delay filter output, the first delay filter input coupled to the deglitching circuit input; a first comparator having a first comparator output and first and second comparator inputs, the first comparator input coupled to the first delay filter output; an inverter having an inverter input and an inverter output, the inverter input coupled to the deglitching circuit input; a second delay filter having a second delay filter input and a second delay filter output, the second delay filter input coupled to the inverter output; a second comparator having a second comparator output and third and fourth comparator inputs, the third comparator input coupled to the second delay filter output, and the fourth comparator input coupled to the second comparator input; an OR gate having an OR gate output and first and second OR gate inputs, the first OR gate input coupled to the first comparator output, and the second OR gate input coupled to the second comparator output; and a latch having a latch output, a clock input, and a latch input, the clock input coupled to the OR gate output, the latch input coupled to the deglitching circuit input, and the latch output coupled to the deglitching circuit output. The system also includes a digital circuit coupled to the deglitching circuit output, the digital circuit having a half-cycle path.

In yet another example, a circuit includes a first delay filter configured to provide a first ramp responsive to a rising edge of an input signal; a first comparator coupled to the first delay filter and having a first comparator output, the first comparator configured to provide a first signal at the first comparator output responsive to a voltage of the first ramp being greater than a threshold voltage; a second delay filter configured to provide a second ramp responsive to a falling edge of the input signal; a second comparator coupled to the second delay filter and having a second comparator output, the second comparator configured to provide a second signal at the second comparator output responsive to a voltage of the second ramp being greater than the threshold voltage; and a latch coupled to the first comparator and to the second comparator, the latch configured to sample and provide the input signal at a latch output responsive to a rising edge of the first comparator output or to a rising edge of the second comparator output.

DETAILED DESCRIPTION

Deglitching circuits remove glitches from a digital input signal by requiring a change in the input signal to persist for at least a particular time period, referred to as the deglitching period, before the change is propagated to the output of the deglitching circuit. In some cases, a delay is introduced in the rising and falling edge of the digital input signal in order to filter out any pulse (e.g., on time (TON) or off time (TOFF)) shorter than the duration of the delay. A deglitching circuit receives an input signal and provides an output signal based on the input signal. The deglitching circuit reduces the likelihood that a glitch present in the input signal is transmitted to the output signal. In some cases, the deglitching circuit impacts the duty cycle of the input signal, or produces an output signal having a different duty cycle than the input signal. Examples in this description include a deglitching circuit that reduces the variation of the duty cycle of the output signal relative to the duty cycle of the input signal.

Figure 1A:
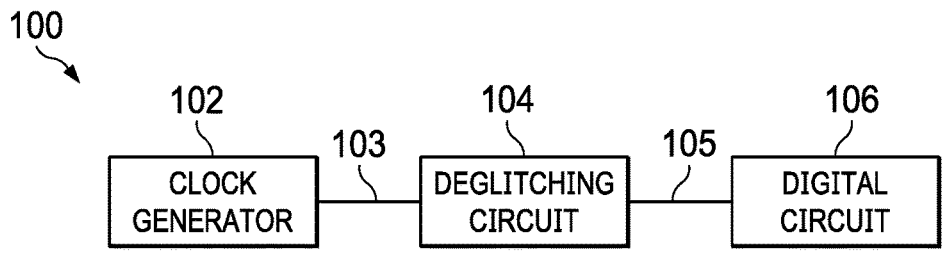
FIGS. 1a and 1b are block diagrams of systems including a deglitching circuit in accordance with various examples.

FIG. 1a is a block diagram of a system 100 in accordance with examples of this description. The system 100 includes a clock signal generator 102 that provides a clock signal 103 as its output signal, which has a duty cycle and a frequency. The clock signal 103 is provided as an input to a deglitching circuit 104. The deglitching circuit 104 is configured to produce a deglitched output signal 105 based on the input clock signal 103. In particular, the deglitched output signal 105 does not contain or contains a reduced number of glitches (e.g., signal transients having a duration less than a deglitching period) that are present in the input clock signal 103.

For example, if the clock signal 103 has an internal frequency of 10 megahertz (MHz), a period of the clock signal 103 is 100 nanoseconds (ns). In this example, the clock signal 103 has a maximum tolerable frequency of 20 MHz (e.g., to satisfy a hold-time requirement of a digital circuit 106), which results in a period of the clock signal 103 being 50 ns. In an example with a 50% duty cycle, each half-period is 25 ns. In this example, the deglitching circuit 104 introduces variations of up to +/−5 ns to the deglitching period, and thus the deglitching circuit 104 is designed with a deglitching period of 30 ns, such that the minimum deglitching period is 25 ns, which satisfies the maximum tolerable frequency of 20 MHz. In this example, glitches or transients less than at least 25 ns should be filtered out by the deglitching circuit 104. For example, if the input clock signal 103 is HIGH, subsequently transitions to LOW for a duration of only 20 ns, and then returns to HIGH (e.g., TOFF less than 25 ns), the deglitching circuit 104 filters the transient, and the deglitched output signal 105 remains HIGH. The deglitched output signal 105 is provided as an input to the digital circuit 106. In some examples, the digital circuit 106 includes one or more half-cycle paths (e.g., where both the rising edge and falling edge of the deglitched output signal 105 trigger circuit functionality), and thus also benefits from the deglitching circuit 104 providing improved (e.g., reduced) variation in duty cycle from the input clock signal 103 to the deglitched output signal 105.

Figure 1B:
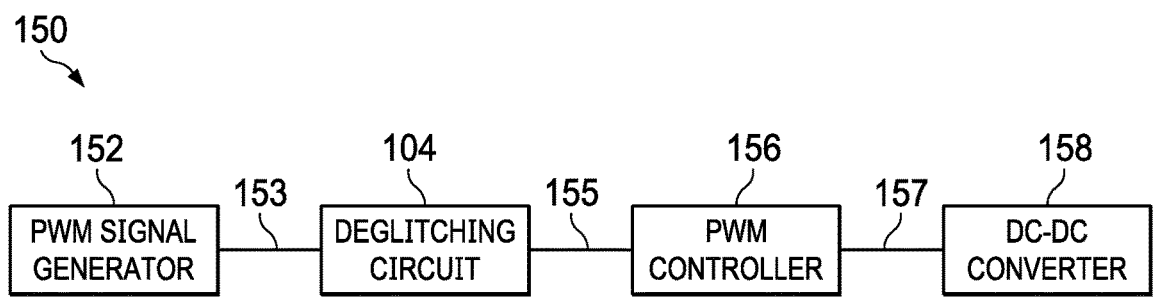

FIG. 1b is a block diagram of another system 150 including the deglitching circuit 104, described above, in accordance with examples of this description. The system 150 includes a PWM signal generator 152 that provides a PWM signal 153 as its output signal, which has a duty cycle and a frequency. The PWM signal 153 is provided as an input to the deglitching circuit 104. The deglitching circuit 104 is configured to produce a deglitched output signal 155 based on the input PWM signal 153. In particular, the deglitched output signal 155 does not contain or contains a reduced number of glitches (e.g., signal transients having a duration less than a deglitching period) that are present in the input PWM signal 153.

The deglitched output signal 155 is provided as an input to a PWM controller 156, which provides a control signal 157 based on the deglitched output signal 155. In particular, the control signal 157 controls a duty cycle of a circuit such as a DC-DC voltage converter 158. For example, a pulse width of the PWM signal 153, and thus the deglitched output signal 155, causes the DC-DC voltage converter 158 to operate with a particular duty cycle. The PWM controller 156 is configured to convert the pulse width of the deglitched output signal 155 to the control signal 157 to control the duty cycle of the DC-DC voltage converter 158. In these examples, the pulse width of the PWM signal 153 is important because the PWM signal 153 controls the duty cycle of the DC-DC voltage converter 158, and thus also benefits from the deglitching circuit 104 providing improved (e.g., reduced) variation in pulse duration from the input PWM signal 153 to the deglitched output signal 155.

Figure 2:
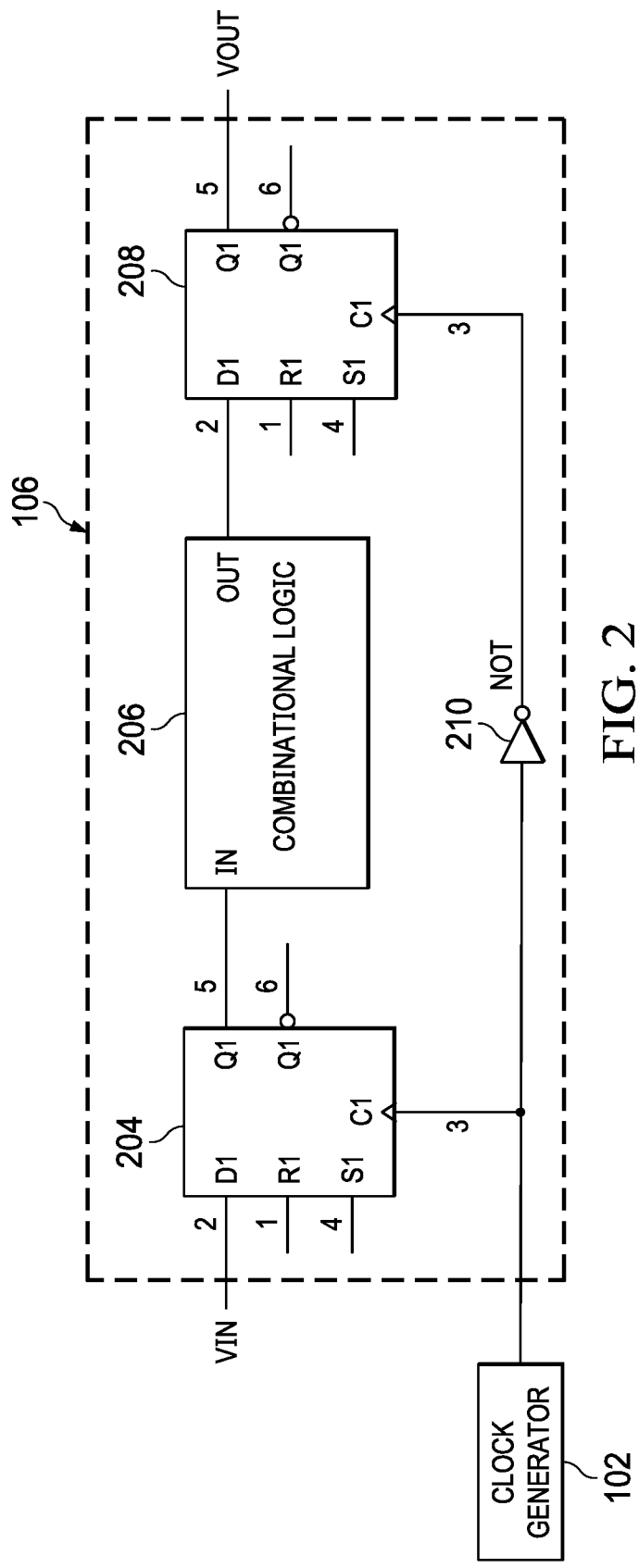
FIG. 2 is a block diagram of a digital circuit including a half-cycle path in accordance with various examples.

FIG. 2 is a block diagram of an example of the digital circuit 106 of FIG. 1a, including a half-cycle path. In the example of FIG. 2, a clock signal is provided by the clock signal generator 102. The digital circuit 106 includes a rising edge circuit path 204, example combinational logic 206, a falling edge circuit path 208. In this example, the presence of both a rising edge circuit path 204 and a falling edge circuit path 208 results in the digital circuit 106 including a half-cycle path. In particular, the rising edge circuit path 204 receives the clock signal as its triggering input, while the falling edge circuit path 208 receives an inverted clock signal as its triggering input due to the inverter 210. Accordingly, the rising edge circuit path 204 is triggered by a rising edge of the clock signal, while the falling edge circuit path 208 is triggered by a falling edge of the clock signal. Thus, the digital circuit 106 benefits from receiving a deglitched clock signal (e.g., from the deglitching circuit 104, described above) because the deglitching circuit 104 reduces the variation in duty cycle from an input clock signal (e.g., from the clock signal generator 102), which increases the likelihood of satisfying minimum hold times for both the rising edge circuit path 204 and the falling edge circuit path 208. For example, a duty cycle of the deglitched clock signal is approximately equal to a duty cycle of the input clock signal.

Figure 3:
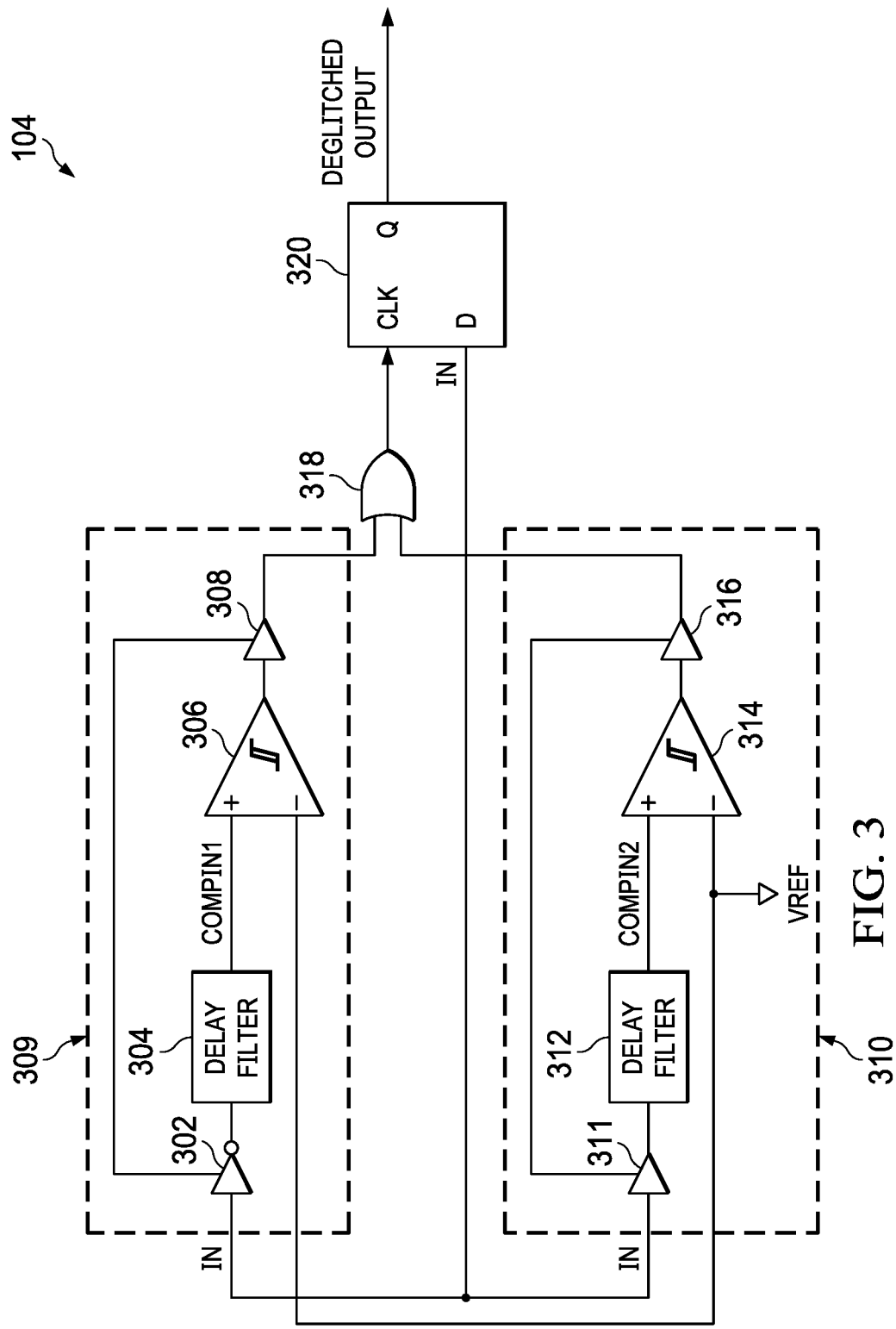
FIG. 3 is a schematic diagram of a deglitching circuit in accordance with various examples.

FIG. 3 is a schematic diagram of the deglitching circuit 104, described above, in accordance with examples of this description. The deglitching circuit 104 is adapted to be coupled to an input signal generating circuit (not shown for simplicity) that is configured to provide an input signal (IN). The clock signal generator 102 and the PWM signal generator 152 described above are examples of the input signal generating circuit (e.g., IN is a clock signal or a PWM signal).

The deglitching circuit 104 includes an inverter 302 having an input that receives the input signal IN and an output. The deglitching circuit 104 also includes a first delay filter 304 that has an input coupled to the output of the inverter 302. The first delay filter 304 has an output and is configured to provide a voltage ramp at its output responsive to a transition of the output of the inverter 302 (e.g., the input of the first delay filter 304). In some examples, the first delay filter 304 is an inverting delay filter 304 that provides the voltage ramp at its output responsive to its input being deasserted and deasserts or resets its output responsive to its input being asserted. In other examples, the first delay filter 304 is a non-inverting delay filter 304 that provides the voltage ramp at its output responsive to its input being asserted and deasserts or resets its output responsive to its input being deasserted. For the purposes of the following description, the first delay filter 304 is an inverting delay filter 304.

The deglitching circuit 104 also includes a first comparator 306 that has a non-inverting input coupled to the output of the first delay filter 304 and an inverting input coupled to a reference voltage source (e.g., a reference voltage terminal that provides a reference or threshold voltage). An output of the first comparator 306 is asserted responsive to the ramp voltage of the output of the first delay filter 304 being greater than a voltage of the reference voltage source (VREF). Accordingly, a deglitching period for the rising edge of the input signal IN (e.g., which causes the inverter 302 output to be deasserted, which begins the voltage ramp at the output of the first delay filter 304) is determined based on the slew rate of the voltage ramp at the output of the first delay filter 304 and the value of the voltage source coupled to the inverting input of the first comparator 306. A transition of the input signal IN from LOW to HIGH that persists for at least the determined deglitching period thus results in the assertion of the output of the first comparator 306. However, a transition of the input signal IN from LOW to HIGH that does not persist for at least the determined deglitching period (e.g., a glitch) does not result in the assertion of the output of the first comparator 306. In other examples, the first comparator 306 is a Schmitt trigger 306 that has an output that is asserted responsive to the first delay filter 304 output being greater than a Schmitt trigger 306 high threshold, which is related to VREF. In some examples, a first buffer 308 receives the output of the first comparator 306 to increase the drive strength of the first comparator 306 output. For ease of reference, in some examples, the inverter 302, the first delay filter 304, the first comparator 306, and the first buffer 308 are referred to as a first channel 309.

The deglitching circuit 104 also includes a second channel 310, which includes a second buffer 311 having an input that also receives the input signal IN, and an output. The second buffer 311 is configured to increase the drive strength of the input signal IN. The second channel 310 also includes a second delay filter 312 that has an input coupled to the output of the second buffer 311. The second delay filter 312 has an output and is similar in function to the first delay filter 304. For the purposes of the following description, the second delay filter 312 is an inverting delay filter 312. However, similar to the first delay filter 304, the second delay filter 312 can also be a non-inverting delay filter 312.

The second channel 310 also includes a second comparator 314 that has a non-inverting input coupled to the output of the second delay filter 312 and an inverting input coupled to a reference voltage source (e.g., a reference voltage terminal that provides a reference or threshold voltage). In an example, the reference voltage source(s) coupled to the inverting inputs of the first comparator 306 and the second comparator 314 provide an approximately equal voltage VREF. An output of the second comparator 314 is asserted responsive to the ramp voltage of the output of the second delay filter 312 being greater than VREF. Accordingly, a deglitching period for the falling edge of the input signal IN (e.g., which causes the second buffer 311 output to be deasserted, which begins the voltage ramp at the output of the second delay filter 312) is determined based on the slew rate of the voltage ramp at the output of the second delay filter 312 and the value of VREF. A transition of the input signal IN from HIGH to LOW that persists for at least the determined deglitching period thus results in the assertion of the output of the second comparator 314. However, a transition of the input signal IN from HIGH to LOW that does not persist for at least the determined deglitching period (e.g., a glitch) does not result in the assertion of the output of the second comparator 314. In other examples, the second comparator 314 is a Schmitt trigger 314 that has an output that is asserted responsive to the second delay filter 312 output being greater than a Schmitt trigger 314 high threshold, which is related to VREF. In some examples, the second channel 310 also includes a third buffer 316 that receives the output of the second comparator 314 to increase the drive strength of the second comparator 314 output.

The deglitching circuit 104 also includes an OR gate 318 that has a first input coupled to the output of the first channel 309 (e.g., the first comparator 306 output or the first buffer 308 output) and a second input coupled to the output of the second channel 310 (e.g., the second comparator 314 output or the third buffer 316 output). The deglitching circuit 104 further includes a latch 320 that has a clock input (CLK) coupled to the output of the OR gate 318 and a latch input adapted to be coupled to the input signal generating circuit, and thus receives the input signal IN. A latch output of the latch 320 is a deglitched output signal (e.g., deglitched output signal 105 or 155, described above) that is derived from the input signal IN. In an example, the latch 320 is a latch 320, the latch input is a D flip-flop input, and the latch output is a D flip-flop output.

Accordingly, responsive to the output of the first channel 309 being asserted responsive to a rising edge of the input signal IN that remains HIGH for at least the deglitching period, the output of the OR gate 318 is asserted and the latch 320 samples the input signal IN and latches the sampled value to its output as the deglitched output signal. Similarly, responsive to the output of the second channel 310 being asserted responsive to a falling edge of the input signal IN that remains LOW for at least the deglitching period, the output of the OR gate 318 is asserted and the latch 320 samples the input signal IN and latches the sampled value to its output as the deglitched output signal. The output of the first delay filter 304, and thus the first channel 309, is deasserted or reset responsive to a falling edge of the input signal IN, while the output of the second delay filter 312, and thus the second channel 310, is deasserted or reset responsive to a rising edge of the input signal IN.

In the event that an input signal IN rising edge does not remain HIGH or a falling edge does not remain LOW for at least the deglitching period, the output of the first channel 309 or the second channel 310, respectively, is not asserted. Accordingly, the latch 320 does not sample the input signal IN and thus the latch 320 output value remains the same. In this way, glitches in the input signal IN are not passed through to the deglitched output signal at the output of the latch 320.

In the example of FIG. 3, the deglitching circuit 104 has an improved (e.g., increased) accuracy of the implemented deglitching period because the rising edge delay implemented by the first channel 309 and the falling edge delay implemented by the second channel 310 are independent of the voltage of the input signal IN, which can vary based on process and temperature variations. Also, because the rising edge delay and the falling edge delay are implemented by decoupled, independent channels (e.g., the first and second channels 309, 310, respectively) and are both dependent on the reference voltage VREF, any variation in the value of VREF affects both the first and second channels 309, 310, which reduces the duty cycle variation responsive to process and temperature variation impacts to the value of VREF. As described further below, in some examples, the components of the first and second channels 309, 310 are matched and, as a result, each of the first channel 309 and the second channel 310 is affected similarly by process, voltage, and temperature (PVT) variations, which increases the accuracy of the deglitching circuit 104 relative to a deglitching circuit that includes a single channel to generate both the rising edge delay and the falling edge delay.

Figure 4:
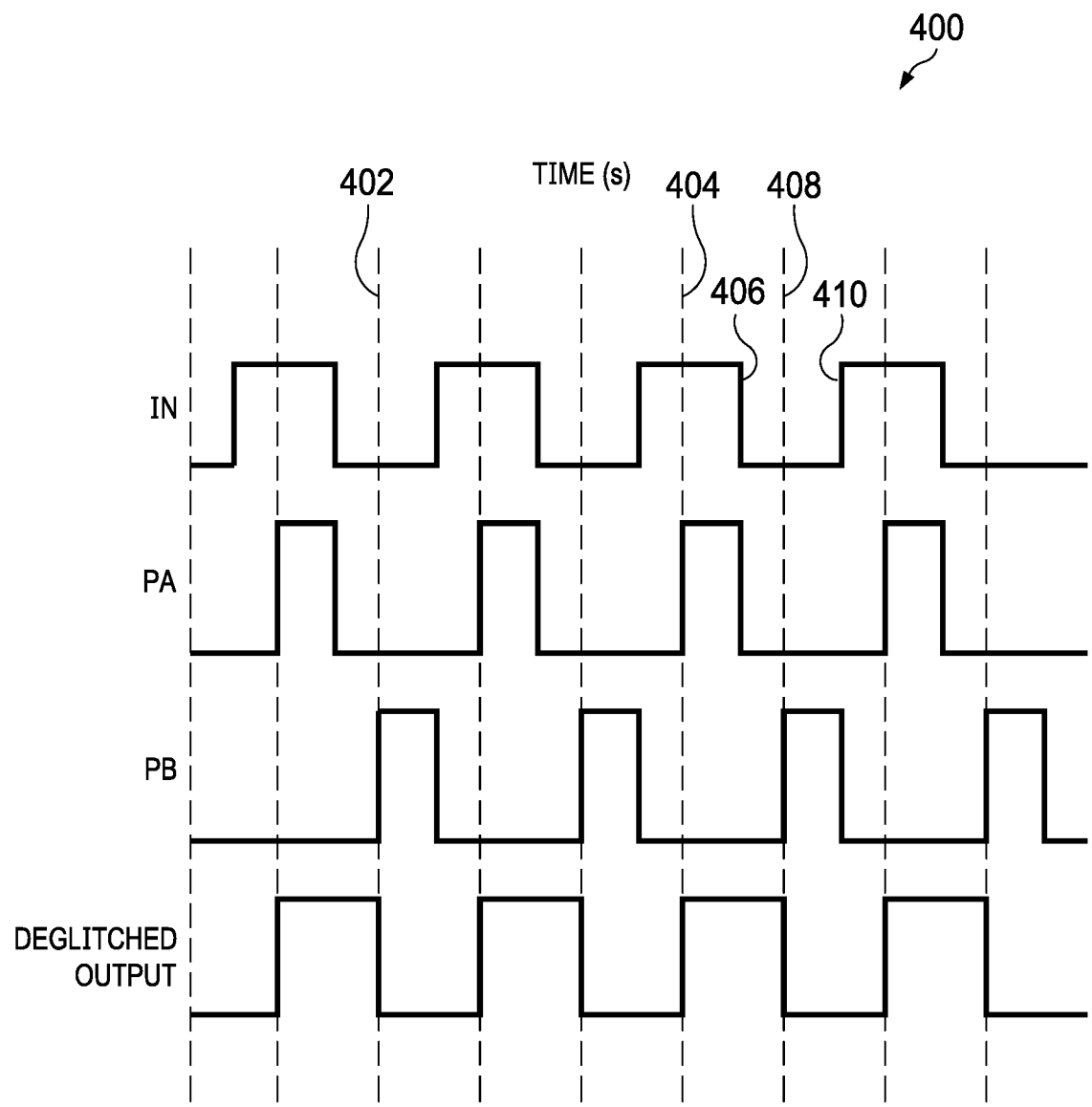
FIG. 4 is a timing diagram for the deglitching circuit in accordance with various examples.

FIG. 4 is a timing diagram 400 for various signals (e.g., voltages) of the deglitching circuit 104 as a function of time in accordance with various examples. The timing diagram 400 includes the input signal IN, the output of the first channel 309 (PA), the output of the second channel 310 (PB), and the output of the latch 320 (DEGLITCHED OUTPUT). For the purposes of the following description, the first and second delay filters 304, 312 are inverting delay filters.

At time 402, a rising edge occurs as the input signal IN is asserted. Accordingly, the output of the inverter 302 is deasserted, which causes the first delay filter 304 to provide a voltage ramp at its output. The deglitching period is determined based on the slew rate of the voltage ramp at the output of the first delay filter 304 and the value of VREF, which is provided to the first comparator 306. In the example of FIG. 4, at time 404, the deglitching period is satisfied and the output of the first channel 309 (PA) is asserted responsive to the output of the first delay filter 304 being greater than VREF. Responsive to PA being asserted, the output of the OR gate 318 is asserted, which causes the latch 320 to sample the input signal IN and latch the input signal IN value to its output. Thus, at time 404, DEGLITCHED OUTPUT is asserted.

At time 406, a falling edge occurs as the input signal IN is deasserted. As a result, the output of the inverter 302 is asserted, which causes the first delay filter 304 to deassert or reset its output. At the same time, the output of the second buffer 311 is deasserted, which causes the second delay filter 312 to provide a voltage ramp at its output. As above, the deglitching period is determined based on the slew rate of the voltage ramp at the output of the second delay filter 312 and the value of VREF, which is provided to the second comparator 314. In the example of FIG. 4, at time 408, the deglitching period is satisfied and the output of the second channel 310 (PB) is asserted responsive to the output of the second delay filter 312 being greater than VREF. Responsive to PB being asserted, the output of the OR gate 318 is asserted, which causes the latch 320 to sample the input signal IN and latch the input signal IN value to its output. Thus, at time 408, DEGLITCHED OUTPUT is deasserted. At time 410, a rising edge occurs as the input signal IN is again asserted. As a result, the output of the second buffer 311 is asserted, which causes the second delay filter 312 to deassert or reset its output.

In the event that a glitch is present in the input signal IN, the input signal IN remains asserted for an amount of time less than the deglitching period implemented by the first delay filter 304. Accordingly, the output of the first delay filter 304 does not exceed VREF before the output of the first delay filter 304 is reset responsive to a falling edge of the input signal IN, and thus PA is not asserted. Because PA is not asserted responsive to the input signal IN being asserted for an amount of time less than the deglitching period, the latch 320 does not latch the input signal IN to its output, and DEGLITCHED OUTPUT retains its previous deasserted value.

In another example, in the event that a glitch is present in the input signal IN, the input signal IN remains deasserted for an amount of time less than the deglitching period implemented by the second delay filter 312. Accordingly, the output of the second delay filter 312 does not exceed VREF before the output of the second delay filter 312 is reset responsive to a rising edge of the input signal IN, and thus PB is not asserted. Because PB is not asserted responsive to the input signal IN being deasserted for an amount of time less than the deglitching period, the latch 320 does not latch the input signal IN to its output, and DEGLITCHED OUTPUT retains its previous asserted value.

Figure 5:
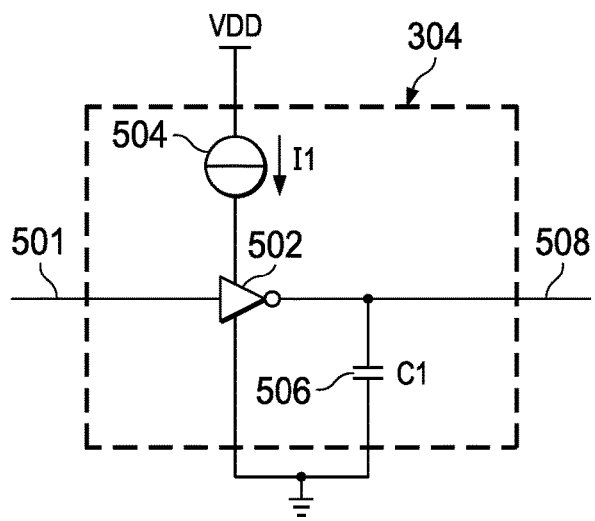
FIG. 5 is a schematic diagram of a delay filter for the deglitching circuit in accordance with various examples.

FIG. 5 is a first example schematic diagram of the first delay filter 304 (or the second delay filter 312) for the deglitching circuit 104 in accordance with various examples. The delay filter 304 includes an input terminal 501, which is coupled to the output of the inverter 302 in the example of FIG. 3. The input terminal 501 is an input to an inverter 502. The delay filter 304 includes a current source 504 coupled to a supply voltage node or terminal VDD and to the inverter 502. The current source 504 is configured to supply a current I1. The inverter 502 is configured to provide the current I1 to its output responsive to the input terminal 501 to the inverter 502 being deasserted. The inverter 502 is also configured to deassert its output responsive to the input terminal 501 to the inverter 502 being asserted, and thus the example of FIG. 5 is an inverting delay filter 304.

The delay filter 304 also includes a capacitor 506 coupled to a ground node or terminal and to the output of the inverter 502, which is also an output terminal 508 of the delay filter 304. The capacitor 506 has a capacitance C1, which is charged responsive to the inverter 502 providing the current I1 to its output. The output terminal 508 is adapted to be coupled to the non-inverting input of the first comparator 306 (or the second comparator 314) described above. The values of I1 and C1 determine the slew rate of the voltage ramp provided by the delay filter 304 responsive to the input terminal 501 being deasserted.

In one example, both the first delay filter 304 and the second delay filter 312 are implemented as shown in FIG. 5. The components in the first channel 309 are also matched to the components of the second channel 310 and thus the rising edge delay implemented by the first channel 309 and the falling edge delay implemented by the second channel 310 behave in similar manners (e.g., responsive to PVT variations), which improves the accuracy of the duty cycle of the deglitched output signal relative to the input signal IN. In these examples, being matched refers to being manufactured with a similar process, having a similar physical layout, having similar component values (e.g., current, capacitance, resistance), and/or having similar environmental surroundings and thus matched components behave similarly responsive to various die stresses. For example, the inverter 502 in the first delay filter 304 is approximately matched to the inverter 502 in the second delay filter 312. Similarly, the current source 504 and capacitor 506 in the first delay filter 304 are approximately matched to the current source 504 and capacitor 506 in the second delay filter 312. The first and second comparators 306, 314 are also approximately matched. Further, the accuracy of the deglitching period is improved because the first and second comparators 306, 314 introduce small delays to the first and second channels 309, 310 relative to the deglitching period.

In one example, the deglitching period for the first channel 309 is given by:

$$\frac{(VREF * C1)}{I1}$$

Continuing the above example in which the deglitching period is 30 ns, C1 is equal to 600 femtofarads (fF), I1 is equal to 16 microamps (µA), and REF is equal to 0.8 Volts (V), which results in the 30 ns deglitching period. In this example, the comparator 306 offset across process and temperature variations is 10 mV, while I1 can vary by 4.5% across process and temperature variations, while C1 can vary by 10% across process and temperature variations. The resulting possible error in the deglitching period length across process and temperature variations is equal to the sum of the error of I1, the error in C1, and the error in the comparator 306 threshold, Thus, the possible error in the deglitching period length across processor and temperature variations is approximately 4.5%+10%+10 mV/800 mV*100==15.75%. Also, due to the matching of the components of the first channel 309 and the second channel 310, the possible error in duty cycle (e.g., the duty cycle of the deglitched output signal relative to the input signal IN) is reduced relative to a deglitching circuit in which the rising edge delay and the falling edge delay are implemented in a mismatched manner.

Figure 6:
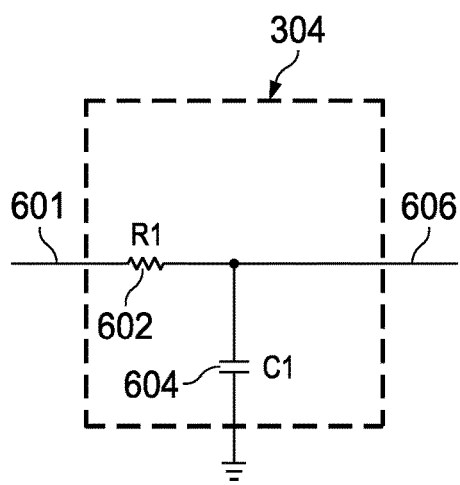
FIG. 6 is a schematic diagram of another delay filter for the deglitching circuit in accordance with various examples.

FIG. 6 is a second example schematic diagram of the first delay filter 304 (or the second delay filter 312) for the deglitching circuit 104 in accordance with various examples. The delay filter 304 includes an input terminal 601, which is coupled to the output of the inverter 302 in the example of FIG. 3. The input terminal 601 is coupled to a first terminal of a resistor 602. The resistor 602 has a resistance R1. The delay filter 304 also includes a capacitor 604 coupled to a ground node or terminal and to a second terminal of the resistor 602, which is also an output terminal 606 of the delay filter 304. The capacitor 604 has a capacitance C1, which is charged responsive to the input terminal 601 being asserted. The capacitor 604 is configured to discharge responsive to the input terminal 601 being deasserted, and thus the example of FIG. 6 is a non-inverting delay filter 304. The output terminal 606 is adapted to be coupled to the non-inverting input of the first comparator 306 (or the second comparator 314) described above. The values of R1 and C1 determine the slew rate of the voltage ramp provided by the delay filter 304 responsive to the input terminal 601 being asserted.

In one example, both the first delay filter 304 and the second delay filter 312 are implemented as shown in FIG. 6. Also, the components in the first channel 309 are matched to the components of the second channel 310 and thus the rising edge delay implemented by the first channel 309 and the falling edge delay implemented by the second channel 310 behave in similar manners, (e.g., responsive to PVT variations), which improves the accuracy of the duty cycle of the deglitched output signal relative to the input signal IN. For example, the resistor 602 and the capacitor 604 in the first delay filter 304 are approximately matched to the resistor 602 and the capacitor 604 in the second delay filter 312. The first and second comparators 306, 314 are also approximately matched (e.g., manufactured with a similar process). Further, the accuracy of the deglitching period is improved because the first and second comparators 306, 314 introduce small delays to the first and second channels 309, 310 relative to the deglitching period.

In this description, certain elements are referred to at times as "first," "second," and the like. These descriptions are not limiting and such elements may be referred to differently at other times, such as in the accompanying claims. For example, either delay filter 304, 312 may be referred to as a "first delay filter" or a "second delay filter." Similarly, either comparator 306, 314 may be referred to as a "first comparator" or a "second comparator," and so on.

In this description, the term "couple" may cover connections, communications, or signal paths that enable a functional relationship consistent with this description. For example, if device A generates a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components illustrated as resistors, unless otherwise stated, are generally representative of any one or more elements coupled in series and/or parallel to provide an amount of impedance represented by the illustrated resistor. For example, a resistor or capacitor illustrated and described herein as a single component may instead be multiple resistors or capacitors, respectively, coupled in series or in parallel between the same two nodes as the single resistor or capacitor. Also, uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value.

Modifications are possible in the described examples, and other examples are possible, within the scope of the claims.

What is claimed is:

1. A circuit, comprising:
a first delay filter having a first delay filter input and a first delay filter output;
a first comparator having a first comparator output and first and second comparator inputs, the first comparator input coupled to the first delay filter output;
an inverter having an inverter input and an inverter output, the inverter input coupled to the first delay filter input;
a second delay filter having a second delay filter input and a second delay filter output, the second delay filter input coupled to the inverter output;
a second comparator having a second comparator output and third and fourth comparator inputs, the third comparator input coupled to the second delay filter output, and the fourth comparator input coupled to the second comparator input;
an OR gate having an OR gate output and first and second OR gate inputs, the first OR gate input coupled to the first comparator output, and the second OR gate input coupled to the second comparator output; and
a latch having a clock input, a latch input and a latch output, the clock input coupled to the OR gate output, the latch input coupled to the inverter input, and the latch configured to provide a deglitched signal at the latch output responsive to the inverter input.

2. The circuit of claim 1, wherein:
the inverter is a first inverter, the inverter input is a first inverter input, and the inverter output is a first inverter output;
the first delay filter includes:

a second inverter having a second inverter input and a second inverter output, the second inverter input coupled to the first inverter input, and the second inverter output coupled to the first comparator input;
a first current source coupled to the second inverter and to a supply terminal; and
a first capacitor coupled to the second inverter output and to a ground terminal; and
the second delay filter includes:
a third inverter having a third inverter input and a third inverter output, the third inverter input coupled to the first inverter output, and the third inverter output coupled to the third comparator input;
a second current source coupled to the third inverter and to the supply terminal; and
a second capacitor coupled to the third inverter output and to the ground terminal.

3. The circuit of claim 2, wherein the first current source and the second current source are matched, the first capacitor and the second capacitor are matched, and the first comparator and the second comparator are matched.

4. The circuit of claim 1, wherein:
the first delay filter includes:
a first resistor coupled to the inverter input and to the first comparator input; and
a first capacitor coupled to the first comparator input and to a ground terminal; and
the second delay filter includes:
a second resistor coupled to the inverter output and to the third comparator input; and
a second capacitor coupled to the third comparator input and to the ground terminal.

5. The circuit of claim 4, wherein the first resistor and the second resistor are matched, the first capacitor and the second capacitor are matched, and the first comparator and the second comparator are matched.

6. The circuit of claim 1, wherein the first comparator is a first Schmitt trigger, and the second comparator is a second Schmitt trigger.

7. The circuit of claim 1, wherein:
an input signal provided to the inverter input is a clock signal; and
the latch output is adapted to be coupled to a digital circuit having a half-cycle path.

8. The circuit of claim 1, wherein:
an input signal provided to the inverter input is a pulse-width modulation (PWM) signal; and
the latch output is adapted to be coupled to a PWM controller for a power converter.

9. The circuit of claim 1, wherein the first comparator input is a first non-inverting input, the second comparator input is a first inverting input, the third comparator input is a second non-inverting input, and the fourth comparator input is a second inverting input.

10. The circuit of claim 1, wherein the second comparator input is coupled to a reference voltage terminal.

11. The circuit of claim 1, wherein the latch is a D flip-flop, the latch input is a D flip-flop input, and the latch output is a D flip-flop output.

12. A system, comprising:
a clock signal generator;
a deglitching circuit having a deglitching circuit input and a deglitching circuit output, the deglitching circuit input coupled to the clock signal generator, the deglitching circuit including:
a first delay filter having a first delay filter input and a first delay filter output, the first delay filter input coupled to the deglitching circuit input;
a first comparator having a first comparator output and first and second comparator inputs, the first comparator input coupled to the first delay filter output;
an inverter having an inverter input and an inverter output, the inverter input coupled to the deglitching circuit input;
a second delay filter having a second delay filter input and a second delay filter output, the second delay filter input coupled to the inverter output;
a second comparator having a second comparator output and third and fourth comparator inputs, the third comparator input coupled to the second delay filter output, and the fourth comparator input coupled to the second comparator input;
an OR gate having an OR gate output and first and second OR gate inputs, the first OR gate input coupled to the first comparator output, and the second OR gate input coupled to the second comparator output; and
a latch having a latch output, a clock input, and a latch input, the clock input coupled to the OR gate output, the latch input coupled to the deglitching circuit input, and the latch output coupled to the deglitching circuit output; and
a digital circuit having a half-cycle path, the digital circuit coupled to the deglitching circuit output.

13. The system of claim 12, wherein:
the inverter is a first inverter, the inverter input is a first inverter input, and the inverter output is a first inverter output;
the first delay filter includes:
a second inverter having a second inverter input and a second inverter output, the second inverter input coupled to the deglitching circuit input, and the second inverter output coupled to the first comparator input;
a first current source coupled to the second inverter and to a supply terminal; and
a first capacitor coupled to the second inverter output and to a ground terminal; and
the second delay filter includes:
a third inverter having a third inverter input and a third inverter output, the third inverter input coupled to the first inverter output, and the third inverter output coupled to the third comparator input;
a second current source coupled to the third inverter and to the supply terminal; and
a second capacitor coupled to the third inverter output and to the ground terminal.

14. The system of claim 13, wherein the first current source and the second current source are matched, the first capacitor and the second capacitor are matched, and the first comparator and the second comparator are matched.

15. The system of claim 12, wherein:
the first delay filter includes:
a first resistor coupled to the deglitching circuit input and to the first comparator input; and
a first capacitor coupled to the first comparator input and to a ground terminal; and
the second delay filter includes:
a second resistor coupled to the inverter output and to the third comparator input; and
a second capacitor coupled to the third comparator input and to the ground terminal.

16. The system of claim 15, wherein the first resistor and the second resistor are matched, the first capacitor and the second capacitor are matched, and the first comparator and the second comparator are matched.

17. The system of claim 12, wherein the first comparator is a first Schmitt trigger, and the second comparator is a second Schmitt trigger.

* * * * *